(12) United States Patent
Park et al.

(10) Patent No.: US 9,005,998 B2
(45) Date of Patent: Apr. 14, 2015

(54) LASER ANNEALING APPARATUS AND METHOD, AND DISPLAY APPARATUS MANUFACTURED BY THIS METHOD

(71) Applicant: Samsung Display Co., Ltd., Yongin, Gyeonggi-do (KR)

(72) Inventors: Cheol-Ho Park, Yongin (KR); Byung-Sul Kim, Yongin (KR); Jong-Hyun Yun, Yongin (KR); Hee-Geun Son, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/943,304

(22) Filed: Jul. 16, 2013

(65) Prior Publication Data

US 2014/0284608 A1    Sep. 25, 2014

(30) Foreign Application Priority Data

Mar. 25, 2013  (KR) .......................... 10-2013-0031707

(51) Int. Cl.
| | |
|---|---|
| *H01L 21/67* | (2006.01) |
| *H01L 27/12* | (2006.01) |
| *H01L 21/324* | (2006.01) |
| *B23K 26/00* | (2014.01) |
| *B23K 26/08* | (2014.01) |

(52) U.S. Cl.
CPC .......... *H01L 27/1222* (2013.01); *H01L 21/324* (2013.01); *H01L 21/67115* (2013.01); *H01L 27/1274* (2013.01); *B23K 26/0042* (2013.01); *B23K 26/0048* (2013.01); *B23K 26/0066* (2013.01); *B23K 26/0853* (2013.01); *B23K 2201/40* (2013.01)

(58) Field of Classification Search
CPC .......................... H01L 21/67115; H01L 21/324
USPC .............................................................. 438/7
See application file for complete search history.

(56) References Cited

U.S. PATENT DOCUMENTS 7,462,802 B2 * 12/2008 Hiramatsu ............... 219/121.71
2008/0220553 A1    9/2008 Park et al.

FOREIGN PATENT DOCUMENTS

| KR | 10-2008-0081605 | 10/2008 |
|---|---|---|
| KR | 10-2011-0132095 | 12/2011 |
| WO | WO 97/23806 | 3/1997 |

* cited by examiner

*Primary Examiner* — Tran Tran
(74) *Attorney, Agent, or Firm* — Knobbe Martens Olson & Bear LLP (57) ABSTRACT

A laser annealing apparatus reduces laser annealing time and has a simple configuration. A laser annealing method is used to manufacture a display apparatus. The laser annealing apparatus includes a mounting unit, a substrate mounted on the mounting unit, first and second driving modules installed on the mounting unit and adjusting locations of first and second mark masks to be placed on a part of the substrate, first and second image modules that may obtain image data regarding the first and second mark masks to be location-adjusted by first and second driving modules, and a laser module that radiates a laser beam to the substrate and changes at least a part of an amorphous silicon layer of the substrate to crystalline silicon.

8 Claims, 4 Drawing Sheets

LASER ANNEALING APPARATUS AND METHOD, AND DISPLAY APPARATUS MANUFACTURED BY THIS METHOD

CROSS-REFERENCE TO RELATED APPLICATIONS

This application claims the benefit of Korean Patent Application No. 10-2013-0031707, filed on Mar. 25, 2013, in the Korean Intellectual Property Office, the disclosure of which is herein incorporated by reference in its entirety.

BACKGROUND

1. Field

The present disclosure relates to a laser annealing apparatus and method, and a display apparatus manufactured by this method, which reduce a laser annealing time and simplify related configurations.

2. Description of the Related Technology

In general, an organic light-emitting display apparatus, a liquid crystal display apparatus, and the like determine whether to emit light from each pixel, or determine a light emitting level of each pixel, by using a thin film transistor (TFT). Such a TFT typically includes a semiconductor layer, a gate electrode, a source/drain electrode, and the like. Crystalline silicon that is obtained by crystallizing amorphous silicon is used for the semiconductor layer.

In order to manufacture a TFT substrate including such a TFT or a display apparatus using the substrate, an amorphous silicon layer is formed on the entire surface of a substrate and crystallized to crystalline silicon, and then the crystalline silicon is patterned so that it remains only where a TFT is placed.

However, this typical manufacturing process has limitations in that it is costly and time consuming to crystallize the amorphous silicon layer to polysilicon, related processes are complex, and a structure of a related apparatus is also complex.

SUMMARY OF CERTAIN INVENTIVE ASPECTS

The present disclosure provides a laser annealing apparatus and method, and a display apparatus manufactured by using this method, which reduce a laser annealing time and simplify related processes. However, these advantages are merely exemplary and the scope of the present disclosure is not limited thereto.

According to an aspect of the present invention, there is provided a laser annealing apparatus, including a mounting unit, a substrate mounted on the mounting unit; a first driving module and a second driving module, having locations fixed relative to the mounting unit, the first driving module configured to adjust a location of a first mark mask located on a first part of the substrate, the second driving module configured to adjust a location of a second mark mask located on a second part of the substrate; a first image module and a second image module, the first image module configured to obtain image data regarding the first mark mask, the second image module configured to obtain image data regarding the second mark mask; and a laser module configured to radiate a laser beam to the substrate to change at least a part of an amorphous silicon layer of the substrate to crystalline silicon.

The laser module may be configured to radiate a laser beam to the first mark mask and the second mark mask to respectively form a first mark and a second mark on the amorphous silicon layer of the substrate. In this case, the laser module may form a first crystalline silicon mark and a second crystalline silicon mark on the amorphous silicon layer.

In particular, the laser module may radiate a laser beam to preset areas of the substrate to change at least a part of the amorphous silicon layer of the substrate to crystalline silicon, and the preset areas of the substrate may include areas corresponding to the first mark mask and the second mark mask.

The laser module may be configured to form, on the amorphous silicon layer, a first crystalline silicon mark and a second crystalline silicon mark that are surrounded by amorphous silicon.

The first driving module and the second driving module may be configured to adjust locations of the first mark mask and the second mark mask to respectively allow the location of the first mark mask relative to the first image module to be a preset location and the location of the second mark mask relative to the second image module to be a preset location.

In this case, the first driving module and the second driving module may be configured to adjust the locations of the first mark mask and the second mark mask respectively on the basis of image data regarding the first mark mask obtained by the first image module and image data regarding the second mark mask obtained by the second image module. The laser module may be configured to radiate a laser beam to the substrate to change at least a part of the amorphous silicon layer.

The laser annealing apparatus may further include a pre-aligning image module configured to obtain image data regarding the substrate. In this case, the pre-aligning image module may be configured to obtain image data regarding edges of the substrate.

According to another aspect of the present invention, there is provided a laser annealing method, including arranging, on a mounting unit, a substrate which has an amorphous silicon layer; arranging a first mark mask and a second mark mask respectively on a first part and a second part of the amorphous silicon layer of the substrate; adjusting a location of the first mark mask relative to a first image module and adjusting a location of the second mark mask relative to a second image module; and radiating a laser beam to the first mark mask, to the second mark mask, and to at least a part of areas of the amorphous silicon layer of the substrate that do not correspond to the first mark mask and the second mark mask, thereby changing the areas of the amorphous silicon layer of the substrate to which a laser beam is radiated to crystalline silicon.

The changing to the crystalline silicon may include radiating a laser beam to the first mark mask and the second mark mask to form a first mark and a second mark on the amorphous silicon layer of the substrate.

The changing to the crystalline silicon may include radiating a laser beam to the first mark mask and the second mark mask to form a first crystalline silicon mark and a second crystalline silicon mark on the amorphous silicon layer of the substrate.

The changing to the crystalline silicon may include radiating a laser beam to preset areas of the substrate to change at least a part of the amorphous silicon layer of the substrate to crystalline silicon, the preset areas of the substrate including parts corresponding to the first mark mask and the second mark mask of the substrate.

The changing to the crystalline silicon may include radiating a laser beam to the first mark mask and the second mark mask to form, on the amorphous silicon layer of the substrate, a first crystalline silicon mark and a second crystalline silicon mark mask that are surrounded by amorphous silicon The adjusting of the location of the first mark mask relative to the first image module and the location of the second mark mask relative to the second image module may include adjusting locations of the first mark mask and the second mark mask on the basis of image data regarding the mark mask obtained by the first image module and image data regarding the second mark mask obtained by the second image module.

The changing to the crystalline silicon may be performed while locations of the first mark mask and the second mark mask relative to the substrate are fixed.

The laser annealing method may further include adjusting a location of the substrate relative to a pre-aligning image module.

According to another aspect of the present invention, there is provided a display apparatus, including a substrate, a semiconductor layer placed on the substrate, the semiconductor layer including an amorphous silicon area and a crystalline silicon area and the semiconductor layer further including a first crystalline silicon mark and a second crystalline silicon mark that are surrounded by amorphous silicon, a thin film transistor TFT placed on the substrate and having the crystalline silicon area as an active layer, and a display device electrically connected to the TFT.

The first mark and the second mark of the semiconductor layer may be placed outside a display area.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

Embodiments of the present invention will now be described in detail with reference to the accompanying drawings, in which certain embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the dimensions of components may be exaggerated or reduced for convenience of illustration. For example, since the size and thickness of each component in the drawings is arbitrarily shown for convenience of illustration, the present invention is not limited thereto.

In the following embodiments, the x axis, y axis, and z axis are not limited to three axes on a rectangular coordinate system but may be construed as having a wider meaning. For example, the x axis, y axis and z axis may be orthogonal to one another or may refer to different directions that are not orthogonal to one another.

When any of various components such as a layer, a film, an area, a plate, or the like is referred to as being 'on' another layer or substrate, it may be directly on the other layer or substrate, or intervening layers may also be present.

Figure 1:
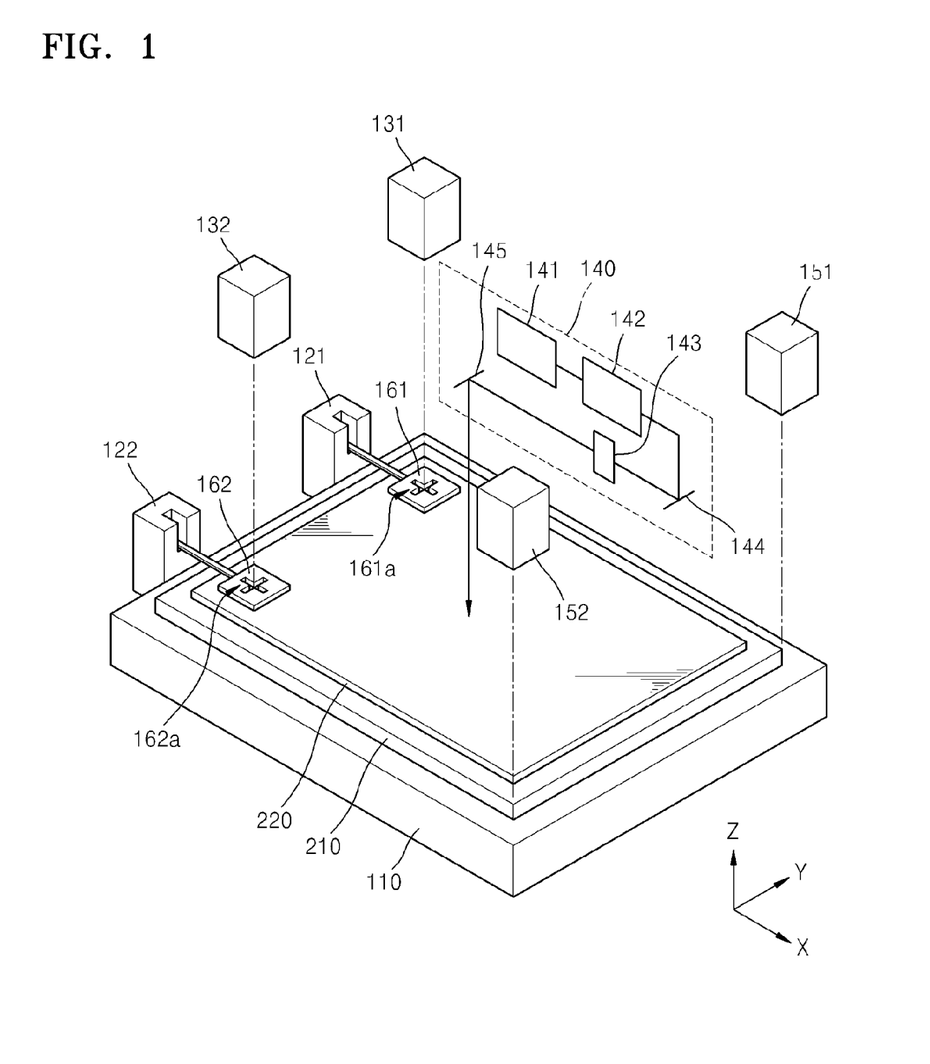
FIG. 1 is a schematic perspective view of a laser annealing apparatus according to an embodiment of the present invention.

FIG. 1 is a schematic perspective view of a laser annealing apparatus according to an embodiment of the present invention. As illustrated in FIG. 1, the laser annealing apparatus according to an embodiment includes a mounting unit 110, a first driving module 121, a second driving module 122, a first image module 131, a second image module 132, and a laser module 140.

A substrate 210 may be mounted on the top of the mounting unit 110. The mounting unit 110 may include a chuck, for example. The mounting unit 110 may enable a location of the mounted substrate 210 to be adjusted by a stage in a plane (xy plane). In this case, the stage may be a part of the mounting unit 110 or may be a component separate from the mounting unit 110.

The substrate 210 that is mounted on the mounting unit 110 has an amorphous silicon layer 220 on top thereof (in +z direction). The amorphous silicon layer 220 may be formed on the entire top surface of the substrate 210 or may be formed to cover a part of the top surface of the substrate 210 and not to cover a part thereof (such as, for example, edges).

The substrate 210 may be mounted on the mounting unit 110 in various ways. For example, a plurality of pins (not shown), that ascend and descend (along the z axis), ascend to appear above the top surface (in +z direction top surface) of the mounting unit 110 through a plurality of through holes (not shown) passing through the mounting unit 110. Then, the substrate 210 is mounted by a transfer robot onto the plurality of pins and the plurality pins descend so that the substrate 210 is mounted and supported on the mounting unit 110. Before the plurality of pins descend, a process of aligning the substrate 210 with the mounting unit 110 may be further performed.

The first and second driving modules 121 and 122 are installed so that their locations relative to the mounting unit 110 are fixed even if the mounting unit 110 is moved by the stage.

The first driving module 121 may adjust a location of a first mark mask 161 to be placed on a part of the substrate 210 mounted on the mounting unit 110 and the second driving module 122 may adjust a location of a second mark mask 162 to be placed on a different part of the substrate 210 mounted on the mounting unit 110. In particular, the first driving module 121 may adjust the location of the first mark mask 161 to make the location of the first mask 161 relative to the first image module 131 have a preset location and the second driving module 122 may adjust the location of the second mark mask 162 to make the location of the second mark mask 162 relative to the second image module 132 have a preset location. The first and second mark masks 161 and 162 are described below in further detail.

The first image module 131 may obtain image data regarding the first mark mask 161 which is location-adjusted by the first driving module 121, and the second image module 132 may obtain image data regarding the second mark mask 162 which is location-adjusted by the second driving module 122. To this end, the first and second image modules 131 and 132 may include an image capturing device such as, for example, a charge coupled device (CCD) and/or a complementary metal-oxide semiconductor (CMOS).

Accordingly, location adjustments of the first and second mark masks 161 and 162 by the first and second driving modules 121 and 122 may correspond to adjusting the locations of the first and second mark masks 161 and 162, based on image data regarding the first mark mask 161 obtained by the first image module 131 and image data regarding the second mark mask 162 obtained by the second image module 132. Since it is possible to identify a location relative to the first image module 131 of the first mark mask 161 from image data regarding the first mark mask 161 obtained by the first image module 131, the first driving module 121 may adjust the location of the first mark mask 161 while identifying its relative location in real time. The second driving module 122 may also adjust the location of the second mark mask 162 while identifying, in real time, a location relative to the second image module 132 of the second mark mask 162 from image data regarding the second mark mask 162 obtained by the second image module 132.

The laser module 140 may radiate a laser beam to the substrate 210 mounted on the mounting unit 110 to change at least a part of the amorphous silicon layer 220 of the substrate 210 to crystalline silicon. This laser module 140 may have various configurations and may have e.g., a laser beam source 141 generating an initial laser beam, an attenuator 142 through which the initial laser beam emitted from the laser beam source 141 passes, a homogenizer 143, and a lens (not shown), as shown. Of course, mirrors 144 and 145 for regulating a path of a laser beam may also be further included, as shown.

The laser module 140 may radiate a laser beam not to the entire surface of the amorphous silicon layer 220 of the substrate 210 but to a preset area thereof, such as, for example, where a TFT will be placed.

The laser beam emitted by the laser module 140 is in the shape of a spot beam or a line beam. In the case of the spot beam shape, a laser beam is radiated in the spot beam shape while moving in a preset direction, and in the case of the line beam shape, a laser beam is just radiated. Thus, the laser beam radiated by the laser module 140 forms an incident area in a shape extended in a preset direction when entering the amorphous silicon layer 220.

Thus, in order to radiate a laser beam to the entire surface of the amorphous silicon layer 220 of the substrate 210, the laser beam should be radiated to different areas for a long time. However, in embodiments of the laser annealing apparatus, the laser beam is radiated only to a preset area, that is, where a TFT will be placed, and not to the entire surface of the amorphous silicon layer 220 of the substrate 210. That is, the laser module 140 radiates the laser beam only to a plurality of preset spaced radiation areas of the amorphous silicon layer 220 of the substrate 210 on which the amorphous silicon layer 220 supported by the mounting unit 110 is formed. Thus, if crystallization on an amorphous silicon layer is performed by using the embodiments of laser annealing apparatus, it is possible to dramatically reduce a crystallization time.

The laser annealing apparatus may further include pre-aligning image modules 151 and 152 as shown. The pre-aligning image modules 151 and 152 may obtain image data regarding the substrate 210 mounted on the mounting unit 110, such as image data regarding the edges of the substrate 210 mounted on the mounting unit 110. Accordingly, while keeping track of a location of the substrate 210 relative to the pre-aligning image modules 151 and 152, it is possible to adjust the relative location of the substrate 210 by using a stage.

Figure 2:
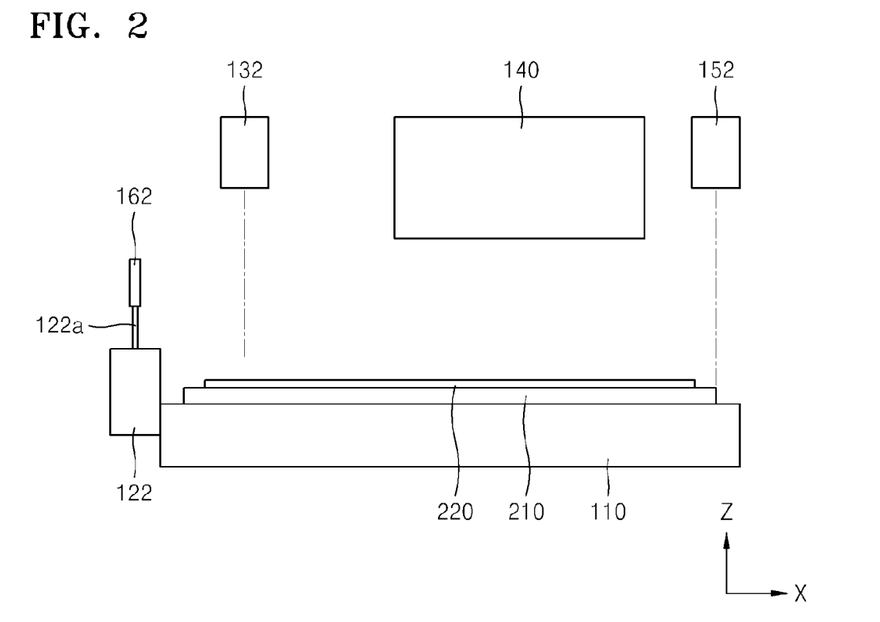
FIGS. 2 and 3 are schematic conceptual side views of an embodiment of changing at least a part of an amorphous silicon layer of a substrate to crystalline silicon by using the laser annealing apparatus of FIG. 1.
Figure 3:
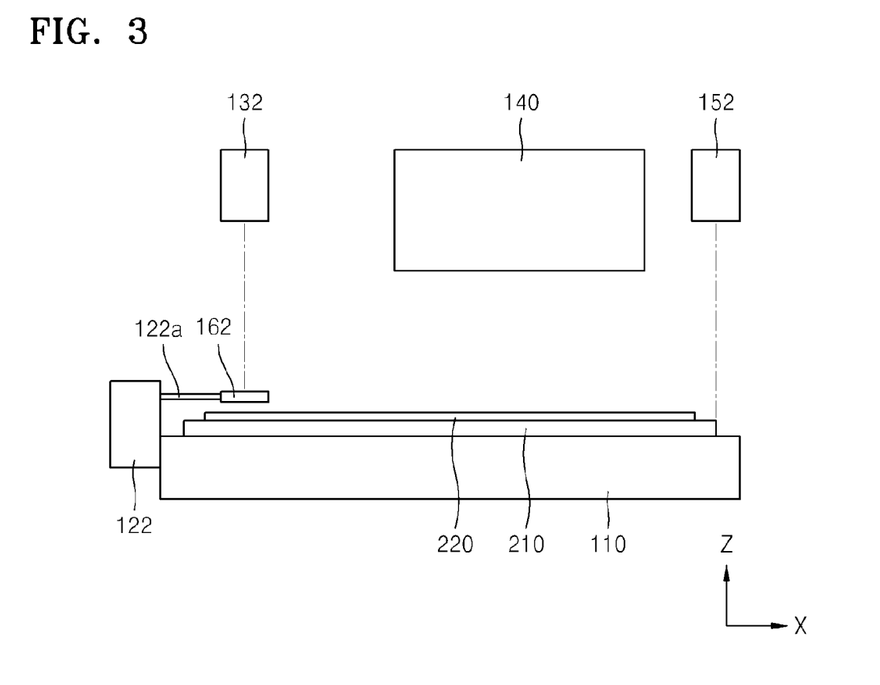

FIGS. 2 and 3 are schematic conceptual side views of an embodiment of changing at least a part of an amorphous silicon layer of a substrate to crystalline silicon by using the laser annealing apparatus of FIG. 1.

As shown in FIG. 2, the substrate 210 on which the amorphous silicon layer 220 has been formed is first mounted on the mounting unit 110. When the substrate 210 is mounted on the mounting unit 110, there is a need to prevent interference with the first mark mask 161 or second mark mask 162. Thus, as shown in FIG. 2, the first and second driving modules 121 and 122 may rotate the first or second mark mask 161 or 162 through about 90° with respect to a mounting surface (on the xy plane) and raise it (in +z direction). It is possible to adjust the location of the first or second mark mask 161 or 162 in various ways. For example, the first and second driving modules 121 and 122 may move the first or second mark mask 161 or 162 backward (in −X direction) in order to place the first or second mark mask 161 or 162 on a part other than where the substrate 210 will be mounted. The second driving module 122 may adjust the location of the second mark mask 162 while supporting it by using a holder 122a. The first driving module 121 may also be adjusted in this way.

The substrate 210 on which the amorphous silicon layer 220 has been formed is mounted on the mounting unit 110, and then by using image data regarding the edges of the substrate 210 obtained by the pre-aligning image modules 151 and 152, the relative location of the substrate 210 is adjusted by using a stage while keeping track of the location of the substrate 210 relative to the pre-aligning image modules 151 and 152. For example, the location of the substrate 210 may be adjusted by using the stage so that each of the edges of the substrate 210 in images from image data obtained by the pre-aligning image modules 151 and 152 is placed on roughly a center of the images.

When the substrate 210 is mounted by a transfer robot onto the mounting unit 110, the substrate 210 is not always placed on the same location on the mounting unit 110. Since this means that the laser module 140 is not always placed on the same location on the substrate 210, the location of the substrate 210 is adjusted by using the pre-aligning image modules 151 and 152. Since the location of the pre-aligning image modules 151 and 152 relative to the laser module 140 is fixed, adjusting the location of the substrate 210 relative to the pre-aligning image modules 151 and 152 means adjusting the location of the substrate 210 relative to the laser module 140.

In this case, when the substrate 210 is mounted by the transfer robot onto the mounting unit 110, a variation level of the substrate 210 relative to the mounting unit 110 may be over about several millimeters, for example. Thus, each of the pre-aligning image modules 151 and 152 should be able to observe a range over several millimeters. In this sense, alignment performed by using the pre-aligning image modules 151 and 152 may thus be understood as rough pre-alignment, not fine alignment which is carried out in a range of about dozens of micrometers to about hundreds of micrometers, for example.

Following the pre-alignment, the first and second driving modules 121 and 122 rotate the first or second mark mask 161 or 162 through about 90° in a direction opposite to an existing rotation direction so that the first or second mark mask 161 or 162 is placed on top of the substrate 210 mounted on the mounting unit 110, as shown in FIG. 3. If the first and second driving modules 121 and 122 move the first or second mark mask 161 or 162 backward (in −X direction) to prevent interference with the first or second mark mask 161 or 162 when mounting the substrate 210 on the mounting unit 110, the first and second driving modules 121 and 122 may move the first or second mark mask 161 or 162 forward (in +X direction).

Changing the locations of the first and second mark masks 161 and 162 may be performed at any time after the substrate 210 is mounted on the mounting unit 110. For example, changing the locations of the first and second mark masks 161 and 162 may be performed prior to the pre-alignment.

Subsequently, based on image data regarding the first mark mask 161 obtained by the first image module 131, and image data regarding the second mark mask 162 obtained by the second image module 132, the first and second driving modules 121 and 122 adjust the locations of the first and second mark masks 161 and 162. For example, in order that each of an opening 161a of the first mark mask 161 and an opening 162a of the second mark mask 162 is placed at roughly a center of images from image data obtained by the first and second image modules 131 and 132, the first and second driving modules 121 and 122 may adjust the locations of the first and second mark masks 161 and 162. Since the relative locations of the first and second image modules 131 and 132 to the laser module 140 are fixed, adjusting the locations of the first and second mark masks 161 and 162 to the first and second image modules 131 and 132 means adjusting the location of the first and second mark masks 161 and 162 relative to the laser module 140. In this case, alignment performed by using the first and second image modules 131 and 132 may be understood as fine alignment which is carried out in a range of about dozens of micrometers to about hundreds of micrometers.

Figure 4:
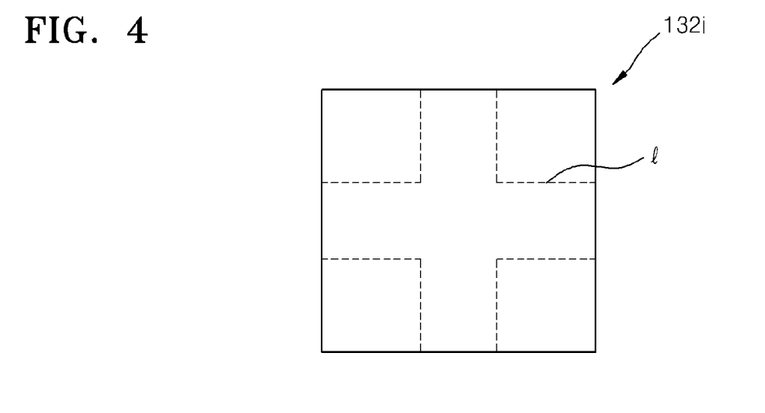
FIGS. 4 to 6 are conceptual views for explaining an embodiment of a fine alignment process in use of the laser annealing apparatus of FIG. 1.
Figure 5:
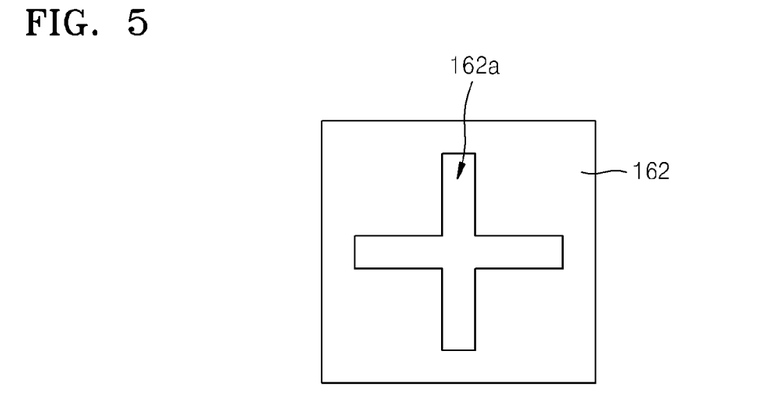
Figure 6:
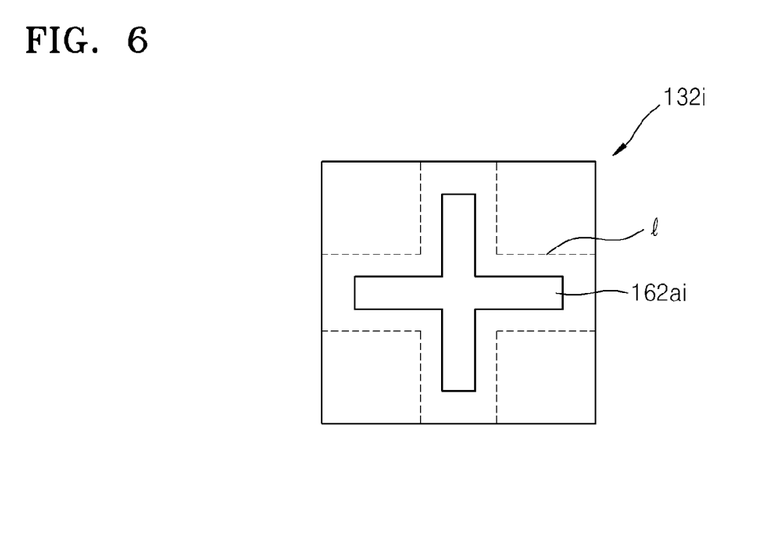

FIGS. 4 to 6 are conceptual views for explaining a fine alignment process in use of the laser annealing apparatus of FIG. 1.

As shown in FIG. 4, an image 132i from image data obtained by the second image module 132 may be an image in which preset lines l exist. The reason may be because the image data obtained by the second image module 132 is processed to represent the preset lines l or because real lines corresponding to the preset l lines are drawn on the lens and/or lens protecting unit of the second image module 132. The same may also be applicable to an image from the image data obtained by the first image module 131.

The second mask 162 may have, on its central part, a cross-shaped opening 162a that has a shape similar to the lines l in the image 132i, as shown in FIG. 5. The same may also be applicable to the first mark mask 161. Of course, each of the first and second mark masks 161 and 162 may not have a real opening but have a configuration in which parts other than a cross-shaped area on a transmissive plate are covered with a shielding material such as chrome.

In this state, the second driving module 122 may adjust the location of the second mark mask 162 so that the image 132i from the image data obtained by the second image module 132 is shown in FIG. 6, that is, the image 162ai of the opening 162a of the second mark mask 162 is placed in or matched with the lines l.

Subsequent to the alignment of the first and second mark masks 161 and 162, a laser beam emitted from the laser module 140 is radiated to the amorphous silicon layer 220 of the substrate 210 to change, to crystalline silicon, parts of the amorphous silicon layer 220 to which the laser beam has been radiated. In this process, as the substrate 210 of which one surface has the amorphous silicon layer 220 moves by means of a stage while being mounted on the mounting unit 110, preset areas of the amorphous silicon layer 220 of the substrate 210 are changed to crystalline silicon.

In this case, the entire surface of the amorphous silicon layer 220 is not changed to the crystalline silicon but a laser beam is selectively radiated only to a plurality of preset spaced radiation areas to change them to the crystalline silicon, as described above. Thus, there is a need for a reference point that may accurately recognize areas where crystalline silicon is formed, in the processes of forming a gate electrode, forming a contact hole, and/or forming a source/drain electrode which is performed on locations related to parts that are changed to the crystalline silicon since the laser annealing process.

For the reference point, the laser module 140 radiates a laser beam to a part of the amorphous silicon layer 220 to be later utilized as an active layer of a TFT, as well as to the first mark mask 161 to be location-adjusted by the first driving module 121 and the second mark mask 162 to be location-adjusted by the second driving module 122 to form first and second marks on the amorphous silicon layer 220 of the substrate 210 mounted on the mounting unit 110.

That is, the laser beam that is emitted from the laser module 140 and radiated to the first and second mark masks 161 and 162 passes through the opening 161a of the first mark mask 161 and the opening 162a of the second mark mask and forms the first and second crystalline silicon marks of the amorphous silicon layer 220 of the substrate 210 mounted on the mounting unit 110. Accordingly, the first and second crystalline silicon marks that are surrounded by amorphous silicon are formed on the amorphous silicon layer 220 of the substrate 210 mounted on the mounting unit 110. For reference, since transmittance of the crystalline silicon is higher than that of the amorphous silicon, the first and second crystalline silicon marks surrounded by the amorphous silicon may be clearly recognized through a vision system, including CCD or CMOS.

As described above, the laser module 140 radiates a laser beam to preset areas of the substrate 210 mounted on the mounting unit 110 to change at least a part of the amorphous silicon layer 220 of the substrate 210 to crystalline silicon. Thus, it may be understood that the preset areas of the substrate 210 include parts corresponding to the first and second mark masks 161 and 162 of the substrate 210 and the first and second marks are thus formed.

If the preset areas of the amorphous silicon layer 220 of the substrate 210 are changed to crystalline silicon through the above-described processes, the first and second marks are appropriately formed on the amorphous silicon layer 220 of the substrate 210, and the locations of the first and second marks relative to other crystalline silicon areas that will be active layers of TFTs are always the same. Thus, following the laser annealing process, other processes are performed based on the first and second marks to be able to manufacture a substrate or display apparatus with the TFT at a high yield.

In embodiments of the laser annealing apparatus, the first and second marks are formed by using the laser module 140 that is used when changing the amorphous silicon layer 220 to crystalline poly-silicon. Thus, there is no need for a separate component to form the first or second mark.

In addition, if there is a separate component to form the first or second mark, the first or second mark is formed and crystalline silicon areas are then formed on preset parts of the formed first or second mark. Since the location of the first or second mark to the laser module 140 has a preset location and laser annealing is then performed, a fine alignment step has been further required. However, in embodiments of the laser annealing apparatus, there is no need for such a further fine alignment step since the first and second marks are naturally formed on preset parts of the crystalline silicon areas that are formed through the laser annealing. Thus, it is possible to simplify the laser annealing process and dramatically reduce a laser annealing time.

Although the laser annealing apparatus has been described so far, the present invention is not limited thereto. For example, a laser annealing method also belongs to the scope of the present invention.

According to the laser annealing method according to an embodiment of the present invention, subsequent to the step of arranging, on the mounting unit 110, the substrate 210 which has the amorphous silicon layer 220 on its top, the step of arranging the first and second mark masks 161 and 162 on a part of the amorphous silicon layer 220 of the substrate 210 and a different part thereof is performed. If necessary, the step of adjusting the location of the substrate 210 to the pre-aligning image modules 151 and 152 is performed.

Subsequently, the step of adjusting the location of the first mark mask 161 to the first image module 131 and that of the second mark mask 162 to the second image module 132 is performed. This step may correspond to the step of adjusting the locations of the first and second mark masks 161 and 162 based on image data regarding the first mark mask 161 obtained by the first image module 131, and image data regarding the second mark mask 162 obtained by the second image module 132.

Subsequently, the same laser beam is, simultaneously or sequentially, radiated to at least a part of areas of the amorphous silicon layer 220 of the substrate 210 that do not correspond to the first and second mark masks 161 and 162, to the first mark mask 161, or to the second mark mask 162. Thus, the step of changing, to crystalline silicon, the parts of the amorphous silicon layer 220 of the substrate 210 to which the laser beam has been radiated is performed. That is, the laser beam is radiated to preset areas of the substrate 210 to change at least a part of the amorphous silicon layer 220 of the substrate 210 to crystalline silicon, and in this case, it may be understood that the preset areas of the substrate 210 include parts corresponding to the first and second mark masks 161 and 162 of the substrate 210.

In this process, parts to be an active layer of a TFT, the first mark, and the second mask are formed, the locations of the first and second marks to the parts to be an active layer of a TFT may naturally be preset locations. For reference, if a laser beam is radiated to the first and second mark masks 161 and 162, it reaches the amorphous silicon layer 220 through the opening 161a of the first mark mask 161 and the opening 162a of the second mark mask 162, and first and second crystalline silicon marks surrounded by amorphous silicon are formed on the amorphous silicon layer 220.

In embodiments of the laser annealing method, even if a separate step of forming the first and second marks is not performed, the first and second marks may be naturally formed on preset parts of areas of the amorphous silicon layer 220 that are changed to crystalline silicon. Thus, it is possible to dramatically reduce a manufacturing time and simplify a manufacturing process. In addition, since the first and second marks are formed by using the laser module 140 that changes the amorphous silicon layer 220 to crystalline silicon, there is no need for a separate component to form the first and second marks and it is thus possible to simplify a configuration of an apparatus necessary for the laser annealing process.

The step of changing the amorphous silicon layer 220 to crystalline silicon may be performed while the laser module 140 is fixed and the substrate 210 moves by a stage. In this case, the step of changing the amorphous silicon layer 220 to crystalline silicon needs to be performed while the locations of the first and second mark masks 161 and 162 to the substrate 210 are fixed. This may be achieved because the first and second driving modules 121 and 122 that control the locations of the first and second mark masks 161 and 162 are fixed to the mounting unit 110 on which the substrate 210 is mounted, and the first and second driving modules 121 and 122 do not operate while the step of changing the amorphous silicon layer 220 to crystalline silicon is performed.

Figure 7:
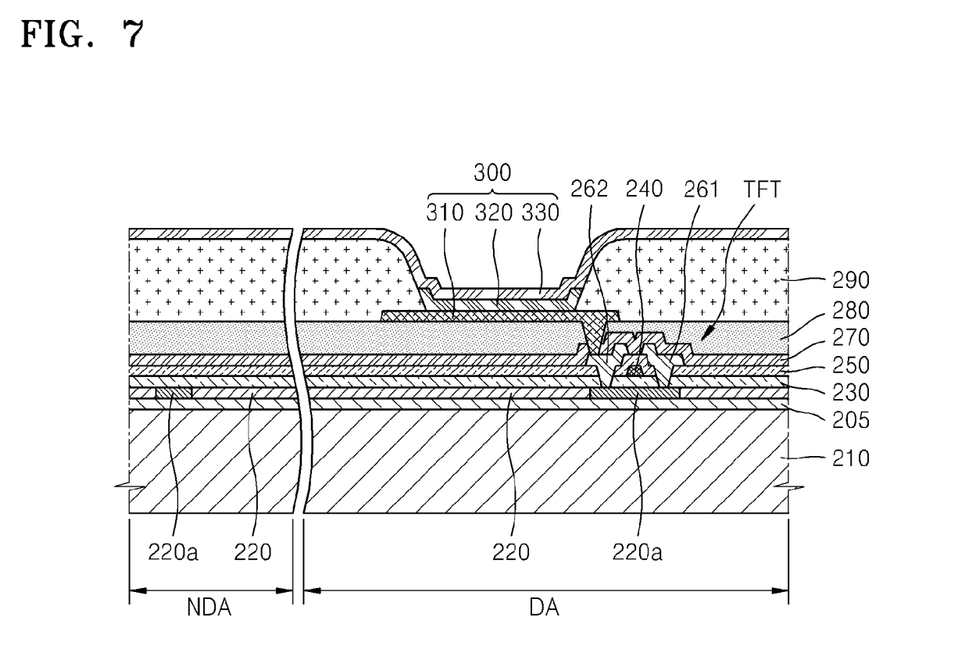
FIG. 7 is a schematic sectional view of a part of a display apparatus according to another embodiment of the present invention.

FIG. 7 is a schematic sectional view of a part of a display apparatus according to another embodiment of the present invention, such as an organic light-emitting display apparatus.

The organic light-emitting display apparatus according to the present embodiment includes a substrate 210, a semiconductor layer, a TFT, and a display device. FIG. 7 represents that an organic light-emitting device 300 is used as the display device.

In this case, the substrate 210 may be the entire substrate 210 described with respect to FIG. 1 or a part of the substrate 210 of FIG. 1. The substrate 210 may be formed of a transparent material, e.g., a glass material, a plastic material, or a metal material.

Common layers such as a buffer layer 205, a gate insulating film 230, an inter-layer insulating film 250 may be formed on the entire surface of the substrate 210, and the semiconductor layer including the amorphous silicon area 220 and a crystalline silicon area 220a may also be formed on the entire surface of the substrate 210. In addition, the crystalline silicon area 220a of the semiconductor layer may be an active layer and the TFT including a gate electrode 240, a source electrode 261 and a drain electrode 262 may be formed on the substrate 210.

In addition, a protective film 270 that covers such a TFT, and a planarization film 280 that is placed on the protective film 270 and of which top is roughly planar may be formed on the entire surface of the substrate 210. The organic light-emitting device 300 that includes a patterned pixel electrode 310, a counter electrode 330 corresponding roughly to the entire surface of the substrate 210, and a multi-structured intermediate layer 320 disposed between the pixel electrode 310 and the counter electrode 330 and including a light emitting layer may be formed on the planarization film 280. Unlike in FIG. 7, a part of the intermediate layer 320 may be a common layer corresponding roughly to the entire surface of the substrate 210, and a different part thereof may be a patterned layer that is patterned to correspond to the pixel electrode 310. The pixel electrode 310 may be electrically connected to the TFT through a via hole. A pixel defining layer 290 that covers the edges of the pixel electrode 310 and has an opening defining each pixel area may be formed on the planarization film 280 to correspond roughly to the entire surface of the substrate 210.

In this case, the semiconductor layer includes the amorphous silicon area 220 and the crystalline silicon area 220a. The crystalline silicon area 220a is placed in a display area DA and becomes an active layer of the TFT. The crystalline silicon area 220a is also placed in a non-display area NDA outside the display area DA and surrounded by amorphous silicon. The crystalline silicon area 220a that is placed in the non-display area NDA and surrounded by amorphous silicon may be the first or second mark and may be formed by the laser annealing method according to the embodiment described previously with respect to the laser annealing apparatus according to the embodiment described previously.

When manufacturing the organic light-emitting display apparatus with such a structure, a laser annealing process is simplified and a laser annealing time is reduced, and thus it is possible to enhance a manufacturing yield of the organic light-emitting display apparatus and reduce a manufacturing time thereof.

The present invention is not limited to the organic light-emitting display apparatus and for example, a display apparatus with a TFT that has crystalline silicon as an active layer, such as a liquid crystal display apparatus belongs to the scope of the present invention.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A method of manufacturing a display apparatus, the method comprising:
    arranging, on a mounting unit, a substrate which has an amorphous silicon layer;
    arranging a first mark mask and a second mark mask respectively on a first part and a second part of the amorphous silicon layer of the substrate;
    adjusting a location of the first mark mask relative to a first image module and adjusting a location of the second mark mask relative to a second image module; and
    radiating a laser beam to the first mark mask, to the second mark mask, and to at least a part of areas of the amorphous silicon layer of the substrate that do not correspond to the first mark mask and the second mark mask, thereby changing the areas of the amorphous silicon layer of the substrate to which a laser beam is radiated to crystalline silicon.

2. The method of claim 1, wherein the changing to the crystalline silicon comprises radiating the laser beam to the first mark mask and the second mark mask to form a first mark and a second mark on the amorphous silicon layer of the substrate.

3. The method of claim 1, wherein the changing to the crystalline silicon comprises radiating the laser beam to the first mark mask and the second mark mask to form a first crystalline silicon mark and a second crystalline silicon mark on the amorphous silicon layer of the substrate.

4. The method of claim 3, wherein the changing to the crystalline silicon comprises radiating the laser beam to preset areas of the substrate to change at least a part of the amorphous silicon layer of the substrate to crystalline silicon, the preset areas of the substrate including parts corresponding to the first mark mask and the second mark mask of the substrate.

5. The method of claim 3, wherein the changing to the crystalline silicon comprises radiating the laser beam to the first mark mask and the second mark mask to form, on the amorphous silicon layer of the substrate, a first crystalline silicon mark and a second crystalline silicon mark mask that are surrounded by amorphous silicon.

6. The method of claim 1, wherein the adjusting of the location of the first mark mask relative to the first image module and the location of the second mark mask relative to the second image module comprises adjusting locations of the first mark mask and the second mark mask on the basis of image data regarding the mark mask obtained by the first image module and image data regarding the second mark mask obtained by the second image module.

7. The method of claim 1, wherein the changing to the crystalline silicon is performed while locations of the first mark mask and the second mark mask relative to the substrate are fixed.

8. The method of claim 1, further comprising adjusting a location of the substrate relative to a pre-aligning image module.

* * * * *